United States Patent
Roberg (10) Patent No.: US 11,588,507 B2
(45) Date of Patent: Feb. 21, 2023

(54) RADIO FREQUENCY FRONT-END

(71) Applicant: Qorvo US, Inc., Greensboro, NC (US)

(72) Inventor: Michael Roberg, Evergreen, CO (US)

(73) Assignee: Qorvo US, Inc., Greensboro, N (*) Notice: Subject to any disclaimer, the term of this patent is extended or adjusted under 35 U.S.C. 154(b) by 0 days.

(21) Appl. No.: 17/383,502

(22) Filed: Jul. 23, 2021

(65) Prior Publication Data

US 2022/0158666 A1 May 19, 2022

Related U.S. Application Data

(60) Provisional application No. 63/114,169, filed on Nov. 16, 2020.

(51) Int. Cl.
| | |
|---|---|
| *H04B 1/04* | (2006.01) |
| *H04B 1/18* | (2006.01) |
| *H03F 1/02* | (2006.01) |
| *H04B 1/44* | (2006.01) |

(52) U.S. Cl.
CPC ............ *H04B 1/04* (2013.01); *H03F 1/0288* (2013.01); *H04B 1/18* (2013.01); *H03F 2200/198* (2013.01); *H04B 2001/0408* (2013.01)

(58) Field of Classification Search
None
See application file for complete search history.

(56) References Cited

U.S. PATENT DOCUMENTS

| | | | | |
|---|---|---|---|---|
| 5,446,464 | A * | 8/1995 | Feldle | G01S 7/034 333/108 |
| 7,053,706 | B2 * | 5/2006 | Kwon | H03F 1/0205 330/84 |
| 7,414,478 | B2 * | 8/2008 | Elmala | H03F 1/0288 330/295 |
| 9,369,095 | B2 * | 6/2016 | Kobayashi | H03F 1/0261 |
| 9,397,617 | B2 * | 7/2016 | Jeon | H03F 1/0288 |
| 10,484,039 | B2 * | 11/2019 | Mizoguchi | H01P 5/227 |

(Continued)

OTHER PUBLICATIONS

Campbell, C. F., et al. "Wideband High Power GaN on SiC SPDT Switch MMICs," 2010 IEEE MTT-S International Microwave Symposium, Anaheim, Calif., 2010, pp. 145-148.

(Continued)

*Primary Examiner* — Pablo N Tran
(74) *Attorney, Agent, or Firm* — Withrow & Terranova, P.L.L.C.

(57) ABSTRACT

A radio frequency front-end is disclosed having a first power amplifier (PA) having a first PA input and a first PA output, a second PA having a second PA input and a second PA output, and a low-noise amplifier (LNA) having an LNA output connected to a receive output terminal and an LNA input. An input 90° hybrid coupler has a first port input connected to a transmit terminal, a second port input connected to a fixed voltage node through an isolation impedance, a third port output connected to the first amplifier input and a fourth port output connected to the second amplifier input. An output 90° hybrid coupler has a first port output connected to a common terminal, a second port output connected to the LNA input, a third port input connected to the second PA output, and a fourth port input connected to the first PA output.

19 Claims, 5 Drawing Sheets

(56) References Cited

U.S. PATENT DOCUMENTS

| | | | | |
|---|---|---|---|---|
| 2002/0186078 A1* | 12/2002 | Kobayashi | ............ | H03F 1/0288 |
| | | | | 330/124 R |
| 2006/0119433 A1* | 6/2006 | Proehl | .................... | H03F 3/602 |
| | | | | 330/295 |
| 2008/0074735 A1* | 3/2008 | Bakalski | ............... | H03F 1/0277 |
| | | | | 359/337.4 |
| 2008/0132180 A1* | 6/2008 | Manicone | ................ | H04B 1/52 |
| | | | | 455/83 |
| 2017/0019071 A1* | 1/2017 | Kobayashi | ............ | H03F 1/0288 |
| 2022/0123781 A1* | 4/2022 | Forest | .................... | H01Q 1/247 |

OTHER PUBLICATIONS

Cheung, S. K., et al. "MMIC-Based Quadrature Hybrid Quasi-Circulators for Simultaneous Transmit and Receive," in IEEE Transactions on Microwave Theory and Techniques, vol. 58, No. 3, Mar. 2010, pp. 489-497.

Roberg, M., et al. "40 W Ka-Band Single and Dual Output GaN MMIC Power Amplifiers on SiC," 2018 IEEE BiCMOS and Compound Semiconductor Integrated Circuits and Technology Symposium (BCICTS), San Diego, Calif., 2018, pp. 140-143.

Yu, C. S., et al. "Switchless Bi-directional Amplifier," 2006 Asia-Pacific Microwave Conference, Yokohama, 2006, 4 pages.

Zheng, X., et al. "Ka-Band High Power GaN SPDT Switch MMIC," 2013 IEEE Compound Semiconductor Integrated Circuit Symposium (CSICS), Monterey, Calif., 2013, 5 pages.

\* cited by examiner

RADIO FREQUENCY FRONT-END

RELATED APPLICATIONS

This application claims the benefit of provisional patent application Ser. No. 63/114,169, filed Nov. 16, 2020, the disclosure of which is hereby incorporated herein by reference in its entirety.

FIELD OF THE DISCLOSURE

The present disclosure pertains to radio frequency front-ends having power amplifiers, low-noise amplifiers, and switches for transmit and receive operations.

BACKGROUND

Radio frequency front-ends typically include at least one power amplifier, a low-noise amplifier, and a single-pole double-throw switch. The single-pole double-throw switch is used to switch a common port between transmit and receive, where in transmit the power amplifier output is routed to the common port and in receive the low-noise amplifier input is routed to the common port. As frequency, power level, and operating bandwidths increase, the design of the single-pole double-throw switch becomes quite challenging. The current handling of on-state switch field-effect transistor devices becomes problematic at high power and high frequency because switch field-effect transistor periphery cannot be arbitrarily increased while maintaining acceptable performance. What is needed is a radio frequency front-end that reduces the required current handling of the on-state switch devices and in addition improves receive-transmit isolation.

SUMMARY

A radio frequency front-end is disclosed having a first power amplifier (PA) having a first PA input and a first PA output, a second PA having a second PA input and a second PA output, and a low-noise amplifier (LNA) having an LNA output connected to a receive output terminal and an LNA input. Also included is an input 90° hybrid coupler having a first port input connected to a transmit terminal, a second port input connected to a fixed voltage node through an isolation impedance, a third port output connected to the first amplifier input, and a fourth port output connected to the second amplifier input. Further included is an output 90° hybrid coupler having a first port output connected to a common terminal configured to output transmit signals and input receive signals, a second port output connected to the LNA input, a third port input connected to the second PA output, and a fourth port input connected to the first PA output.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
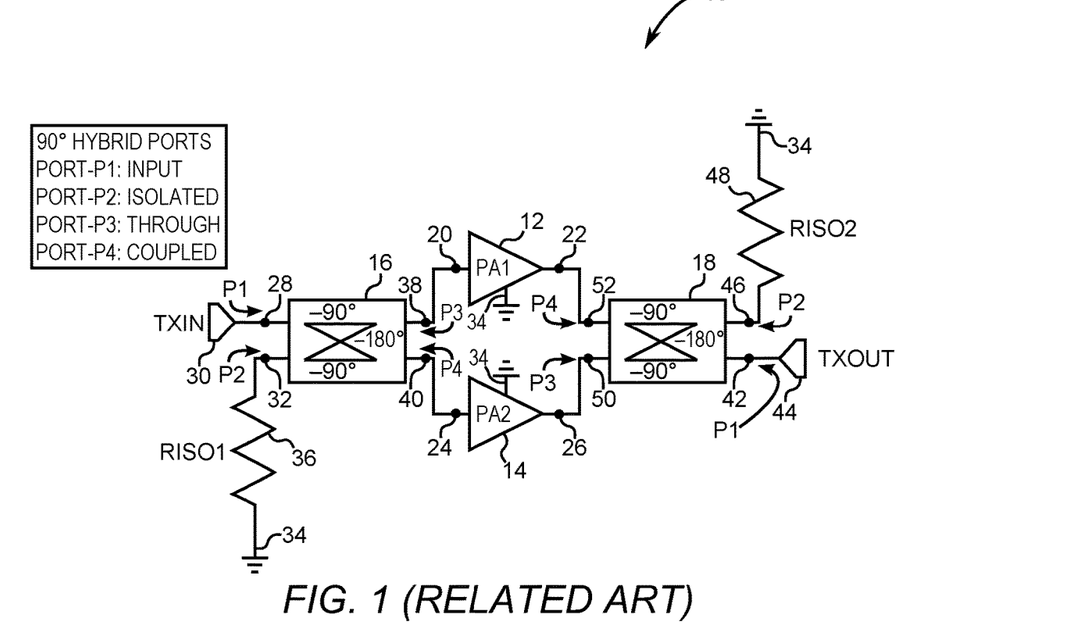
FIG. 1 is a diagram showing a related-art balanced power amplifier architecture.

FIG. 1 is a diagram showing a related-art balanced power amplifier 10. The power amplifier 10 is implemented as a balanced amplifier where an input signal is split in quadrature between a first power amplifier (PA) 12 labeled PA1 and a second PA 14 labeled PA2 by way of an input 90° hybrid coupler 16 configured as a signal splitter and recombined at the output using an output 90° hybrid coupler 18 configured as a signal combiner. The first PA 12 and the second PA 14 may be considered as being half-power amplifiers. The first PA 12 has a first PA input 20 and a first PA output 22. The second PA 14 has a second PA input 24 and a second PA output 26. The input 90° hybrid coupler 16 has a first port input 28 connected to a transmit terminal 30, which is labeled TXIN, and a second port input 32 connected to a fixed voltage node 34 through an isolation impedance 36, which is labeled RISO1. The fixed voltage node 34 may be ground. The input 90° hybrid coupler 16 also has a third port output 38 connected to the first amplifier input 20 and a fourth port output 40 connected to the second amplifier input 24. The output 90° hybrid coupler 18 has a first port output 42 connected to a transmit out terminal 44, which is labeled TXOUT. The output 90° hybrid coupler 18 also has a second port output 46 connected to the fixed voltage node 34 through a second isolation impedance 48, which is labeled RISO2. A third port input 50 is connected to the second PA output 26 and a fourth port input 52 connected to the first PA output 22. Impedance values for each of the first isolation impedance 36 and the second isolation impedance 48 is substantially equal to 50Ω, which results in excellent input and output return loss.

Figure 2:
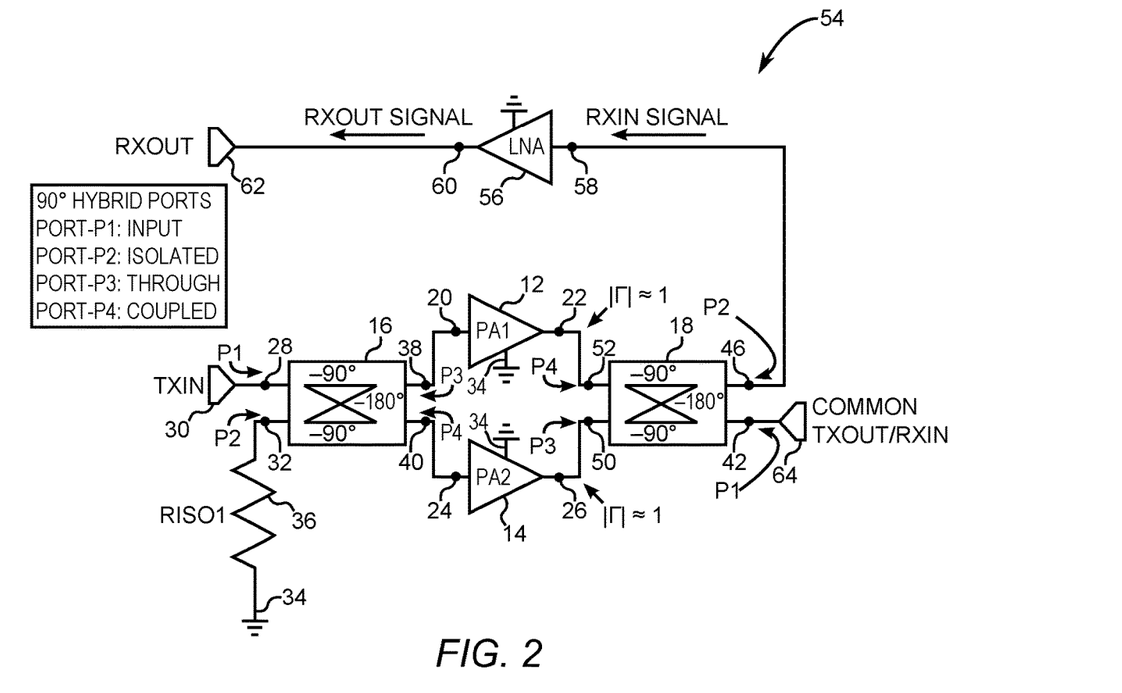
FIG. 2 is a diagram of a radio frequency front-end that is structured in accordance with the present disclosure.

FIG. 2 is a diagram of a radio frequency front-end 54 that is structured in accordance with the present disclosure. In contrast to the related-art power amplifier 10, the radio frequency front-end 54 does not terminate the second port output 46. Instead, the second port output 46 is configured to route a receive signal RXIN to a low-noise amplifier (LNA) 56. The LNA 56 has an LNA input 58 connected to the second port output 46 and an LNA output 60 connected to a receive output terminal 62. The transmit out terminal 44 (FIG. 1) is replaced with a common terminal 64 (i.e., RXOUT) that is configured to route the receive signal RXIN incident to the LNA 56 and output an amplified version of a transmit signal incident at the transmit terminal 30. Highly reflective impedances |Γ| are presented at the third port input 50 and the fourth port 52, respectively. This causes an incident receive signal RXIN at the common terminal to travel through the output 90° hybrid coupler 18, reflect off the highly reflective impedances |Γ|, and re-combine at the second port output 46, which is typically terminated in 50 ohms but is now connected to the LNA input 58. Theoretically, a switching function may be implemented quite well without any switch devices whatsoever, assuming the output matching network loss of the first power amplifier 12 and the second power amplifier 14 is low and output stage devices (not shown) comprising the first power amplifier 12 and the second power amplifier 14 are configured to present the highly reflective impedance in when the first power amplifier 12 and the second power amplifier 14 are turned off. For example, the output stage devices that are typically field-effect transistors (FETs) are actually in the on-state while performing the receive function with drain voltages at 0 V and gate voltages at 0 V.

Figure 3:
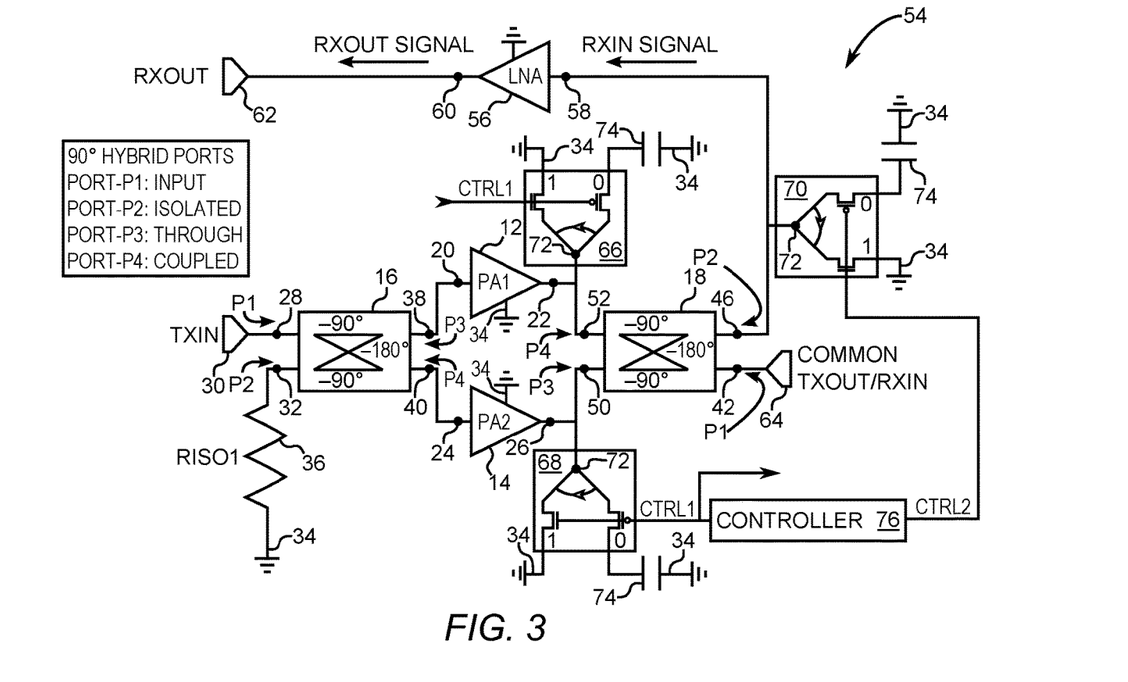
FIG. 3 is a diagram of an embodiment of the radio frequency front-end with shunt switches to increase receive-transmit isolation and reduce receive loss, according to the present disclosure.

Losses of output matching networks (not shown) of the first power amplifier 12 and the second power amplifier 14 may result in too much receive loss because twice the matching network loss is added to the receive loss along with twice the loss of the output 90° hybrid coupler 18. FIG. 3 is a diagram of an embodiment of the radio frequency front-end 54 with a first shunt switch 66, a second shunt switch 68, and a third shunt switch 70 that are employed to increase receive-transmit isolation and reduce receive loss. Each of the shunt switches 66, 68, and 70 includes a first field-effect transistor (FET) labeled 1 to and a second FET labeled 0. A logic level of one will turn on the first FET 1 and turn off the second FET 0 and inversely a logic level of zero will turn off the first FET 1 and turn on the second FET 0. Each of the shunt switches 66, 68, and 70 has a pole 72. The first FET 1 of each of the shunt switches 66, 68, and 70 is connected between the pole 72 and the fixed voltage node 34, so that the pole 72 is shorted directly to the fixed voltage node 34 when the first FET 1 is turned on. The second FET 0 is connected between the fixed voltage node 34 and ground through a shunt capacitor 74, so that the pole 72 provides a capacitive impedance path to the fixed voltage node 34 when the second FET 0 is on. In exemplary embodiments, the fixed voltage node 34 is ground.

In the exemplary embodiment of FIG. 3, the pole 72 of the first shunt switch 68 is connected to a node between the first PA output 22 and the fourth input 52. The pole 72 of the second shunt switch 68 is connected to a node between the second PA output 26 and the third port input 50. The pole 72 of the third shunt switch 70 is connected to a node between the second port output 46 and the LNA input 58.

A controller 76 is configured to control switching of the first shunt switch 66 and the second switch 68 by way of a first control signal CTRL1. The controller 76 turns the first FET 1 on and the second FET 0 off for each of the first shunt switch 66 and the second shunt switch 68 during a transmission operation by way of the control signal CTRL1. Inversely, the controller 76 turns off the first FET 1 and turns on the second FET 0 of the first shunt switch 66 and second shunt switch by way of the control signal CTRL1 while receiving an RF signal through the common terminal 64. In the case that the first FET 1 and the second FET 0 are perfect shorts, no loss is incurred on receive due to the output matching networks of the first power amplifier PA1 and the second power amplifier PA2. Then the receive loss is limited to twice the loss of the output 90° hybrid coupler 18, which functions as a combiner. A full analysis of the losses due to the terminations and the excess loss of the output 90° hybrid coupler 18 are described subsequently.

The TX-RX isolation should be very good due to the inherent signal routing of the balanced amplifier comprised of the first power amplifier 12 and the second power amplifier 14, but inevitably some leakage to the second port output 46 connected to the LNA input 58 occurs in a transmit operation. The isolation is improved further with the third shunt switch 70 at the LNA input 58 that is turned on in transmit operation. This improves the isolation at the expense of bandwidth and receive loss. The controller 76 turns the first FET 1 on and the second FET 0 of the third shunt switch 70 off during transmission by way of a second control signal CTRL2. Inversely, the controller 76 turns off the first FET 1 and turns on the second FET 0 of the third shunt switch 70 by way of the control signal CTRL2 while receiving an RF signal through the common terminal 64.

In an implementation of the radio frequency front-end 54 in a front-end module (FEM), the transmit loss relative to a typical FEM is significantly reduced due to the integration of the typical transmit switching function within the normal balanced power amplifier architecture. This is a relatively large advantage of the embodiments of the present disclosure over a typical FEM.

In an incident signal at common port derivation, assume that the ports of the output 90° hybrid coupler 18 when operating as a power splitter are defined as follows:
P1: Input Port
P2: Isolated Port
P3: Through Port
P4: Coupled Port The S-parameters of a 3 dB 90° hybrid coupler with excess loss defined as L are expressed as $$S = \frac{-L}{\sqrt{2}} \begin{bmatrix} 0 & 0 & j & 1 \\ 0 & 0 & 1 & j \\ j & 1 & 0 & 0 \\ 1 & j & 0 & 0 \end{bmatrix}$$

The linear factor L is defined such that it is actually a gain; for example, it is a number between 0 and 1. Relating L to a loss that is defined as a positive number of decibels, for example, a +3 dB loss, $$L = 10^{\frac{-L_{dB}}{20}}$$

Assume a signal is incident at the input port (port 1), the isolated port (port 2) is terminated in a matched load, the through port (port 3) is terminated in load $\Gamma_L$, and the coupled port (port 4) is terminated in load $\Gamma_L$. The resultant incident ($a_i$) and reflected ($b_i$) waves are expressed as $$b = Sa$$

In expanded form, $$\begin{bmatrix} b_1 \\ b_2 \\ b_3 \\ b_4 \end{bmatrix} = \frac{-L}{\sqrt{2}} \begin{bmatrix} 0 & 0 & j & 1 \\ 0 & 0 & 1 & j \\ j & 1 & 0 & 0 \\ 1 & j & 0 & 0 \end{bmatrix} \begin{bmatrix} a_1 \\ a_2 \\ a_3 \\ a_4 \end{bmatrix}$$

Substituting the initial assumptions $a_2=0$, $a_3=b_3\Gamma_L$, and $a_4=b_4\Gamma_L$, $$\begin{bmatrix} b_1 \\ b_2 \\ b_3 \\ b_4 \end{bmatrix} = \frac{-L}{\sqrt{2}} \begin{bmatrix} 0 & 0 & j & 1 \\ 0 & 0 & 1 & j \\ j & 1 & 0 & 0 \\ 1 & j & 0 & 0 \end{bmatrix} \begin{bmatrix} a_1 \\ 0 \\ b_3\Gamma_L \\ b_4\Gamma_L \end{bmatrix}$$

Expanding, $$\begin{bmatrix} b_1 \\ b_2 \\ b_3 \\ b_4 \end{bmatrix} = \frac{-L}{\sqrt{2}} \begin{bmatrix} jb_3\Gamma_L + b_4\Gamma_L \\ b_3\Gamma_L + jb_4\Gamma_L \\ ja_1 \\ a_1 \end{bmatrix}$$

Based on foregoing equations, $$b_3 = jb_4$$

Substituting, $$\begin{bmatrix} b_1 \\ b_2 \\ b_3 \\ b_4 \end{bmatrix} = \frac{-L}{\sqrt{2}} \begin{bmatrix} -b_4\Gamma_L + b_4\Gamma_L \\ b_3\Gamma_L + b_3\Gamma_L \\ ja_1 \\ a_1 \end{bmatrix} = \frac{-L}{\sqrt{2}} \begin{bmatrix} 0 \\ 2b_3\Gamma_L \\ ja_1 \\ a_1 \end{bmatrix}$$

Simplifying further, $$\begin{bmatrix} b_1 \\ b_2 \\ b_3 \\ b_4 \end{bmatrix} = a_1 \begin{bmatrix} 0 \\ jL^2\Gamma_L \\ -j\frac{L}{\sqrt{2}} \\ -\frac{L}{\sqrt{2}} \end{bmatrix}$$

Investigating the power at the isolated port, $$|b_2|^2 = L^4 |\Gamma_L|^2 |a_1|^2$$

The ratio of the incident power at the input port to the power leaving the isolated port is then $$\frac{|b_2|^2}{|a_1|^2} = L^4 |\Gamma_L|^2$$

Figure 4:
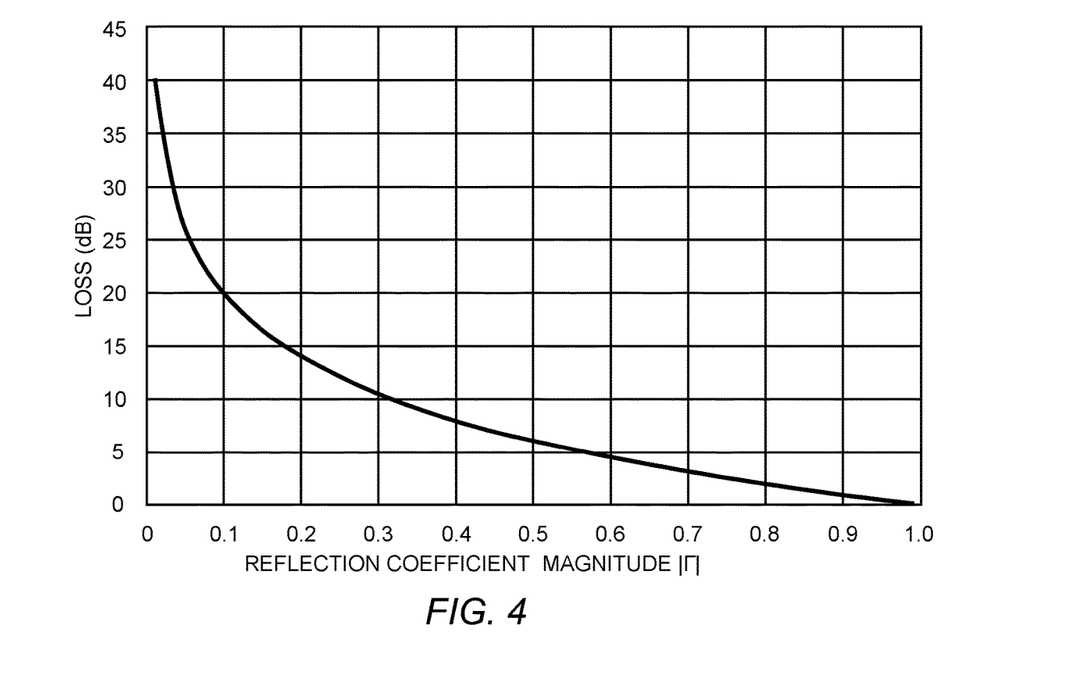
FIG. 4 is a plot showing additional loss versus the magnitude of the reflection coefficient.

Investigating this equation, it is clear that the amount of power at the isolated port is related to the excess loss of the hybrid and to the reflection coefficient at the coupled and through ports. As an example, assume the output 90° hybrid coupler is implemented as a Lange coupler on a 100 μm silicon carbide (SiC) substrate. A typical loss for this exemplary Lange coupler embodiment of the output 90° hybrid coupler is less than approximately 0.25 dB. Based on the foregoing equations, it is clear that the minimum amount of loss between the input and isolated port is 0.5 dB due to the fourth power rather than second power on the loss exponent. That loss is only realized in the case in which purely reflective terminations are presented at the through and coupled ports. The additional loss versus the magnitude of the reflection coefficient is plotted in FIG. 4.

Figure 5:
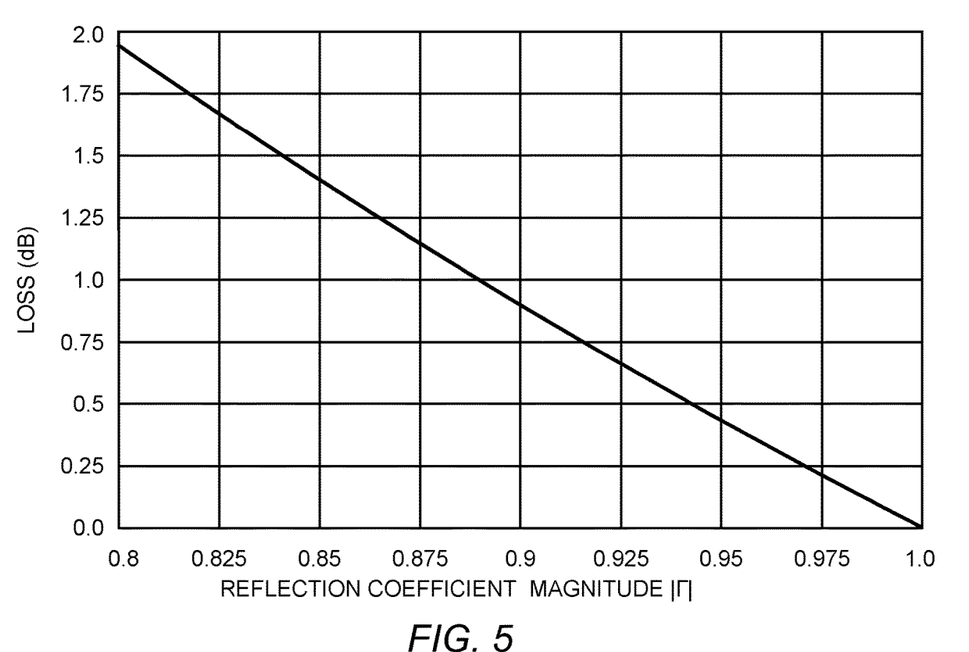
FIG. 5 is a plot more focused on the higher reflection coefficient terminations.

Clearly, the termination needs to be relatively good not to have unacceptable loss. A plot more focused on the higher reflection coefficient terminations is shown in FIG. 5.

Figure 6:
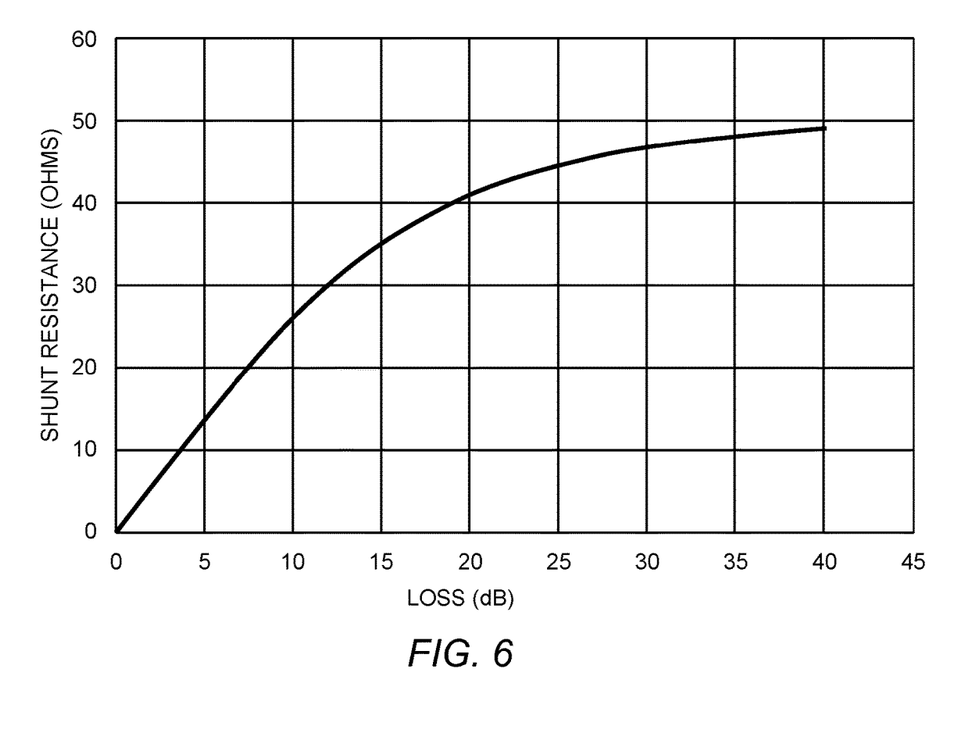
FIG. 6 is a plot showing shunt resistance versus the loss.
Figure 7:
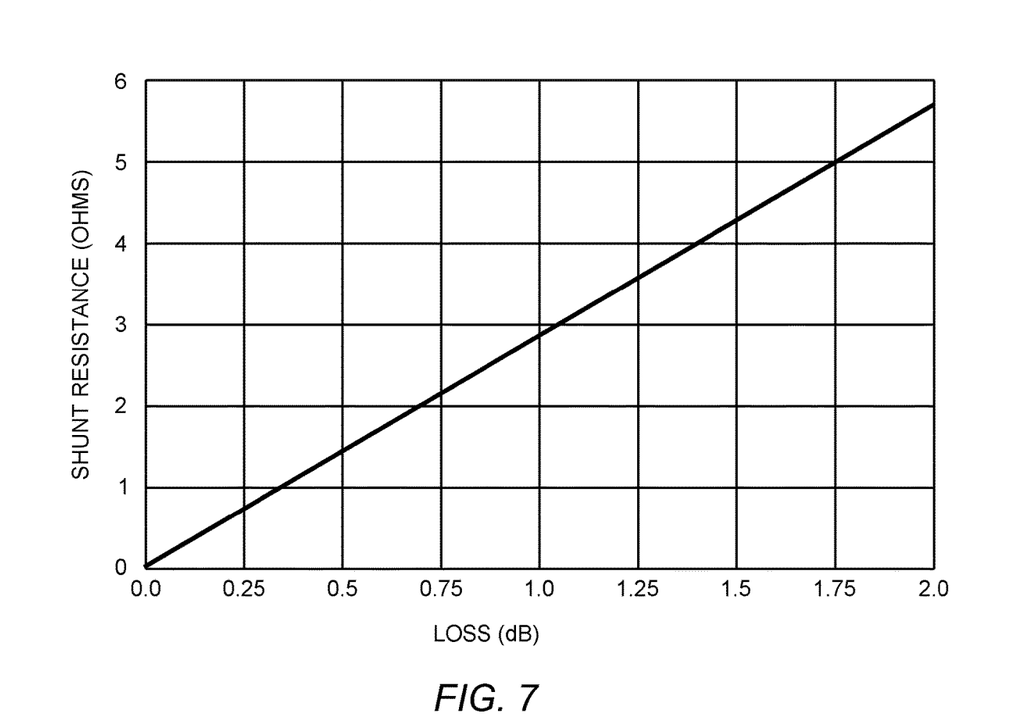
FIG. 7 is a plot showing shunt resistance versus the loss, but with a focus on the useful region.

This curve defines the usable region for the embodiments according to the present disclosure. To keep the total loss less than 1 dB, the reflection coefficient magnitude needs to be greater than approximately 0.94. In terms of implementing this reflection coefficient, likely a shunt switch in the on-state would be used, so it is useful to translate the reflection coefficient to a resistance. This resistance versus the loss is shown in FIG. 6, along with a focused version on the useful region shown in FIG. 7.

Figure 8:
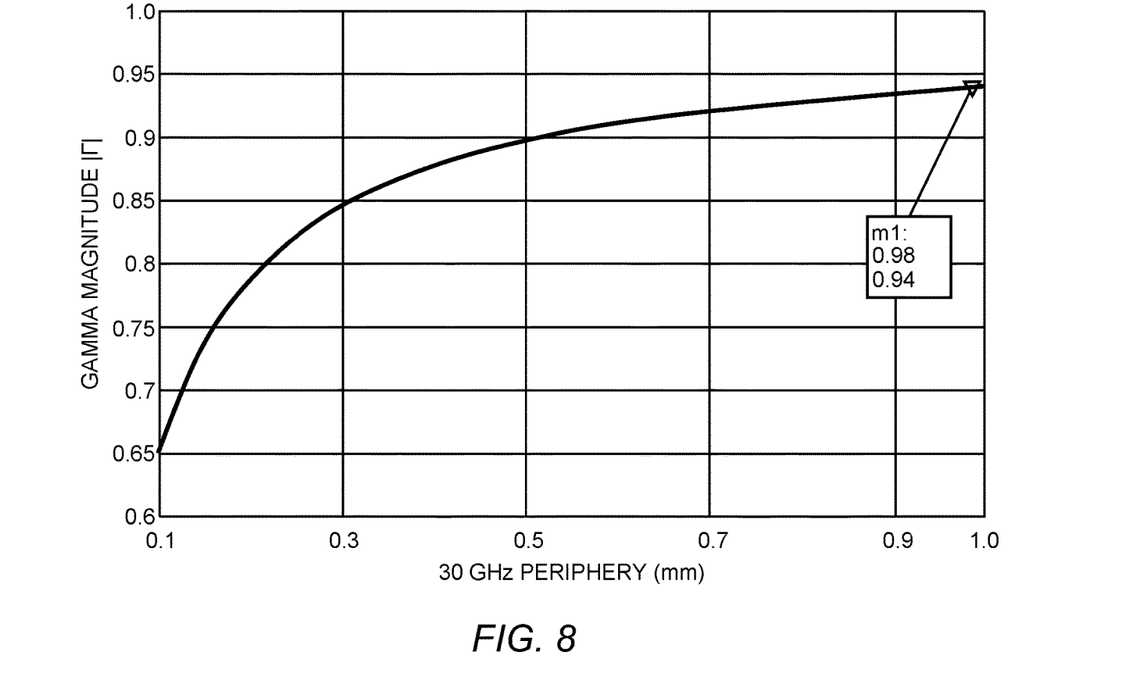
FIG. 8 is a plot showing the magnitude of the reflection coefficient for a shunt switch field-effect transistor fabricated in gallium nitride (GaN) biased to the on-state at 30 GHz.
Figure 9:
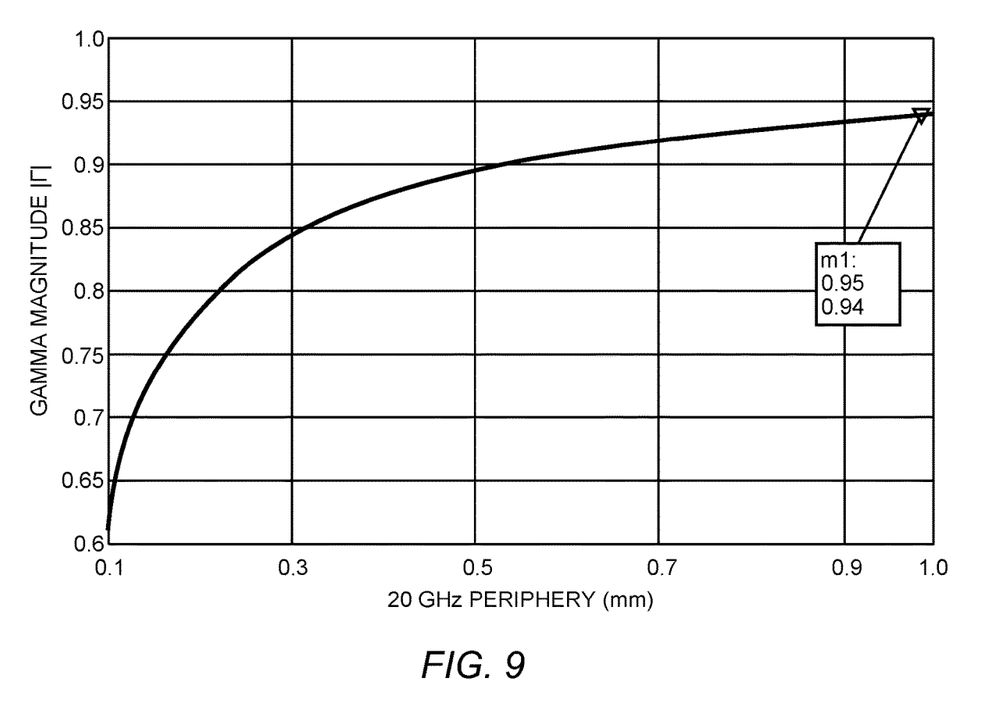
FIG. 9 is a plot showing the magnitude of the reflection coefficient for a shunt switch field-effect transistor fabricated in GaN biased to the on-state at 20 GHz.

For no more than 0.5 dB additional loss due to the termination, the shunt resistance needs to be less than approximately 1.5 Ohms. In a gallium nitride (GaN) based implementation of the embodiment of FIG. 3, the on-resistance of the first FET1 and the second FET 0 is ~1.3 Ohm×mm, so an 0.87 mm shunt device is sufficient to provide this shunt impedance. To demonstrate this, the magnitude of the reflection coefficient for each of the first FET 1 and the second FET 0 in GaN biased to the on-state is shown at both 30 GHz and 20 GHz in FIGS. 8 and 9, respectively. It is close to the numbers previously quoted for necessary switch size, but the peripheries are slightly larger due to the parasitic inductances of the first FET 1 and the second FET 0. At 30 GHz, 984 μm of periphery is required to achieve a 0.94 reflection coefficient magnitude rather than the quick estimate of 870 μm. However, the initial estimate was within 13%. In some embodiments the first FET 1 and the second FET 0 comprising each of the first shunt switch 66, the second shunt switch 68, and the third shunt switch 70 have a periphery of substantially no greater than 1000 μm when operated with radio frequency signals of substantially 30 GHz. The estimate is closer the lower the frequency is, due to the lower impact of the parasitic inductances.

This is well within the realm of possibility, even pushing into ka-band. Certainly it is feasible at frequencies lower than Ka band frequencies. It is necessary to absorb the capacitance of the shunt capacitor 74 in the off-state into the power amplifier matching to ensure proper operation. At some point, the shunt capacitance becomes too large to absorb and is bandwidth limiting.

An additional advantage of the architecture according to the present disclosure is the integration of the switching function with the balanced amplifier, therefore reducing monolithic die or module size. The loss on transmit is reduced to a negligible amount while some penalty is taken on receive due to the loss of the output 90° hybrid coupler 18. However, it is typically easier to increase the output power of a front-end module than it is to reduce the noise figure, so it may be a useful system trade-off to make.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A radio frequency front-end comprising:
   a first power amplifier (PA) having a first PA input and a first PA output;
   a second PA having a second PA input and a second PA output;
   a low-noise amplifier (LNA) having an LNA output connected to a receive output terminal and an LNA input;
   an input 90° hybrid coupler having a first port input coupled to a transmit terminal, a second port input connected to a fixed voltage node through an isolation impedance, a third port output connected to the first amplifier input, and a fourth port output connected to the second amplifier input;
   an output 90° hybrid coupler having a first port output connected to a common terminal configured to output transmit signals and input receive signals, a second port output connected to the LNA input, a third port input connected to the second PA output, and a fourth port input connected to the first PA output; and
   a first shunt switch coupled between the fourth port input and the fixed voltage node, wherein the first shunt switch is configured to provide a capacitive impedance path to the fixed voltage node from the fourth port input when the first power amplifier and the second power amplifier are amplifying a transmit radio frequency signal that arrives at the transmit terminal.

2. The radio frequency front-end of claim 1 wherein the first power amplifier and the second power amplifier are configured to present a reflective impedance |Γ| substantially equal to 1.0 when the first power amplifier and the second power amplifier are turned off.

3. The radio frequency front-end of claim 1 wherein the first shunt switch is further configured to short the fourth port input to the fixed voltage node when the LNA is amplifying a receive radio frequency signal that arrives at the common terminal.

4. The radio frequency front-end of claim 1 further comprising a second shunt switch coupled between the third port input and the fixed voltage node, wherein the second shunt switch is configured to short the third port input to the fixed voltage node when the LNA is amplifying the receive radio frequency signal that arrives at the common terminal.

5. The radio frequency front-end of claim 4 wherein the second shunt switch is further configured to provide a capacitive impedance path to the fixed voltage node from the fourth port input when the first power amplifier and the second power amplifier are amplifying a transmit radio frequency signal that arrives at the transmit terminal.

6. The radio frequency front-end of claim 5 wherein the capacitive impedance path presents a substantial open to the transmit radio frequency signal.

7. The radio frequency front-end of claim 4 further comprising a third shunt switch coupled between the second port output and the fixed voltage node, wherein the third shunt switch is configured to short the second port output to the fixed voltage node when the first power amplifier and the second power amplifier are amplifying a transmit radio frequency signal that arrives at the transmit terminal.

8. The radio frequency front-end of claim 7 wherein the third shunt switch is further configured to provide a capacitive impedance path to the fixed voltage node from the second port output when the LNA is amplifying the receive radio frequency signal that arrives at the common terminal.

9. The radio frequency front-end of claim 8 wherein the capacitive impedance path presents a substantial open to the receive radio frequency signal that arrives at the common terminal.

10. The radio frequency front-end of claim 7 wherein the first shunt switch, the second shunt switch, and the third shunt switch are gallium nitride (GaN) based.

11. The radio frequency front-end of claim 7 further comprising a controller configured to selectively control switching of the first shunt switch, the second shunt switch and the third shunt switch.

12. The radio frequency front-end of claim 7 wherein each of the first shunt switch, the second shunt switch, and the third shunt switch comprises a field-effect transistor configured as a switch.

13. The radio frequency front-end of claim 12 wherein the field-effect transistors comprising each of the first shunt switch, the second shunt switch, and the third shunt switch have a periphery of substantially no greater than 1000 μm when operated with radio frequency signals of substantially 30 GHz.

14. The radio frequency front-end of claim 7 wherein a total loss of less than 1 dB is maintained during operation for a reflection coefficient magnitude greater than approximately 0.94.

15. The radio frequency front-end of claim 1 wherein the fixed voltage node is ground.

16. The radio frequency front-end of claim 1 wherein the output 90° hybrid coupler is implemented as a Lange coupler.

17. The radio frequency front-end of claim 1 wherein the Lange coupler is fabricated from a 100 μm silicon carbide substrate.

18. The radio frequency front-end of claim 17 wherein loss for the Lange coupler is less than approximately 0.25 dB.

19. The radio frequency front-end of claim 1 wherein the isolation impedance provides substantially 50 Ω of resistance.

* * * * *

UNITED STATES PATENT AND TRADEMARK OFFICE
CERTIFICATE OF CORRECTION

| | |
|---|---|
| PATENT NO. | : 11,588,507 B2 |
| APPLICATION NO. | : 17/383502 |
| DATED | : February 21, 2023 |
| INVENTOR(S) | : Michael Roberg |

Page 1 of 1

It is certified that error appears in the above-identified patent and that said Letters Patent is hereby corrected as shown below:

In the Specification
Column 4, Line 42, replace "highly reflective impedance in" with --highly reflective impedance $|\Gamma|$--.

Signed and Sealed this
Twenty-fifth Day of April, 2023

Katherine Kelly Vidal
*Director of the United States Patent and Trademark Office*